(12) United States Patent
Okuyama et al.

(10) Patent No.: US 6,477,093 B2
(45) Date of Patent: Nov. 5, 2002

(54) SEMICONDUCTOR MEMORY AND METHOD OF OPERATING SAME

(75) Inventors: Yoshiaki Okuyama, Kawasaki (JP); Shinya Fujioka, Kawasaki (JP); Waichiro Fujieda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/901,628

(22) Filed: Jul. 11, 2001

(65) Prior Publication Data

US 2002/0024852 A1 Feb. 28, 2002

(30) Foreign Application Priority Data

Aug. 21, 2000 (JP) ........................................ 2000-249392

(51) Int. Cl.[7] ................................................ G11C 8/00
(52) U.S. Cl. .............. 365/195; 365/230.06; 365/230.08
(58) Field of Search ........................... 365/195, 230.06, 365/230.08

(56) References Cited

U.S. PATENT DOCUMENTS 5,691,954 A * 11/1997 Ooishi ................... 365/230.06
5,872,742 A * 2/1999 Kengeri et al. .............. 365/195

FOREIGN PATENT DOCUMENTS

JP 61-153894 12/1986

* cited by examiner

*Primary Examiner*—Huan Hoang
(74) *Attorney, Agent, or Firm*—Arent Fox Kintner Plotkin & Kahn, PLLC

(57) ABSTRACT

An address signal is transmited to a decoder before the activation of a control signal operating a memory cell. Here, the decoder is inactivated. Subsequently, after the activation of the control signal, the reception of a new address signal is inhibited, and the decoder is activated at the same time. Therefore, the decoder starts operating at an earlier timing of the operating cycle, outputting a decoding signal. This means reduction in access time. Moreover, the reception of a new address signal is inhibited after the activation of the control signal. This prevents the decoder from decoding incorrect address signals ascribable to noises and the like, thereby avoiding malfunctions.

7 Claims, 4 Drawing Sheets

# SEMICONDUCTOR MEMORY AND METHOD OF OPERATING SAME

BACKGROUND OF THE INVENTION

1. Field of the Invention

The present invention relates to a technique for operating a semiconductor memory at high speed. In particular, the present invention relates to a technique for transmitting address signals supplied from exterior to internal circuits earlier.

2. Description of the Related Art

In general, address signals supplied to a semiconductor memory are received by address buffers before they are held in latch circuits and supplied to decoders. The latch circuits are controlled by a control signal, such as a chip select signal, which are supplied from exterior. Then, the decoders decode the held address signals to select a word line and a column line corresponding to the memory cell to operate, so that data held in the memory cell is read out. Alternatively, data is written to the memory cell. Meanwhile, in a semiconductor memory having no address-signal latch circuits, address buffers are controlled by the control signal.

Japanese Patent Laid-Open Publication No. Sho 61-153894 and others have disclosed semiconductor memories in which address signals are transmitted to internal circuits earlier for the sake of reduced access time.

In a semiconductor memory of this type, a control signal controls decoders, not address buffers. Address signals supplied from exterior are not controlled by the control signal, but transmitted directly to the decoders. This advances the transmission of the address signals to the internal circuits, thereby reducing access time.

More specifically, in the above-mentioned publication, the control signal controls both the address buffers and the decoders as to column address signals which have smaller influence on the access time, whereas it controls only the decoders as to row address signals which have greater influence on the access time.

Nevertheless, no specific technique has been heretofore disclosed on how to control both the address buffers and the decoders with the control signal so that the address signals are transmitted to internal circuits earlier.

Moreover, when the control signal controls not the address buffers but the decoders alone, the address signals supplied from exterior are constantly transmitted to the decoders. Accordingly, if the address signals undergo a change due to noises and the like occurring on the system board during an activation period of the decoders, the change can be transmitted directly to the decoder (such as a row decoder). As a result, a plurality of word lines might be simultaneously selected for malfunction.

SUMMARY OF THE INVENTION

It is an object of the present invention to transmit address signals supplied from exterior to internal circuits earlier, thereby reducing the access time of the semiconductor memory.

It is another object of the present invention to avoid malfunctions resulting from address signal noises.

According to one of the aspects of the semiconductor memory in the present invention, an address input circuit transmits an address signal supplied from exterior to the internal circuit before a control signal operating a memory cell is activated. The address input circuit inhibits the reception of a new address signal after the control signal is activated. A decoder is inactivated before the activation of the control signal. Therefore, the address signal transmitted from the address input circuit to the decoder will not be decoded at this time. The decoder is activated after the activation of the control signal, to decode the address signal. Thus, making use of the address signal reaching the decoder before the activation of the control signal, the decoder starts operating at an earlier timing of the operation cycle, outputting a decoding signal. This leads to reduction in access time.

The reception of a new address signal is inhibited after the activation of the control signal. This precludes the decoder from decoding incorrect address signals resulting from noises or the like. In other words, the decoding of a plurality of address signals in a single operating cycle is avoided.

According to another aspect of the semiconductor memory in the present invention, the address signal supplied before the activation of the control signal is held in a holding part formed in the address input circuit. Thus, after the reception of a new address is inhibited, the address signal received in advance is surely supplied to the decoder.

According to another aspect of the semiconductor memory in the present invention, the reception of the address signal and the operation of the decoder are controlled by an output enable signal for controlling the external output of data read from the memory cell. This means reduction in read cycle time.

According to another aspect of the semiconductor memory in the present invention, the reception of the address signal and the operation of the decoder are controlled by a write enable signal for controlling the acceptance of data to be written to the memory cell. This means reduction in write cycle time.

According to another aspect of the semiconductor memory in the present invention, the reception of the address signal and the operation of the decoder are controlled by a chip enable signal for activating an internal circuit into an operable state. This means reductions in read cycle time and write cycle time.

According to another aspect of the semiconductor memory in the present invention, the address signal receiving operation and the decoding operation are surely controlled even in a clock asynchronous memory.

According to one of the aspects of the method of operating a semiconductor memory in the present invention, an address signal supplied from exterior is transmitted to a decoder before the activation of a control signal operating a memory cell. Here, the decoder is inactivated. This prevents a decoding signal obtained by decoding the address signal from being output before the activation of the control signal. Subsequently, after the activation of the control signal, the reception of a new address signal is inhibited, and the decoder is activated at the same time. Therefore, as has been described above, the decoder starts operating at an earlier timing with reduction in access time. Moreover, the decoder is prevented from decoding incorrect address signals.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENT

Hereinafter, an embodiment of the present invention will be described with reference to the drawings.

Figure 1:
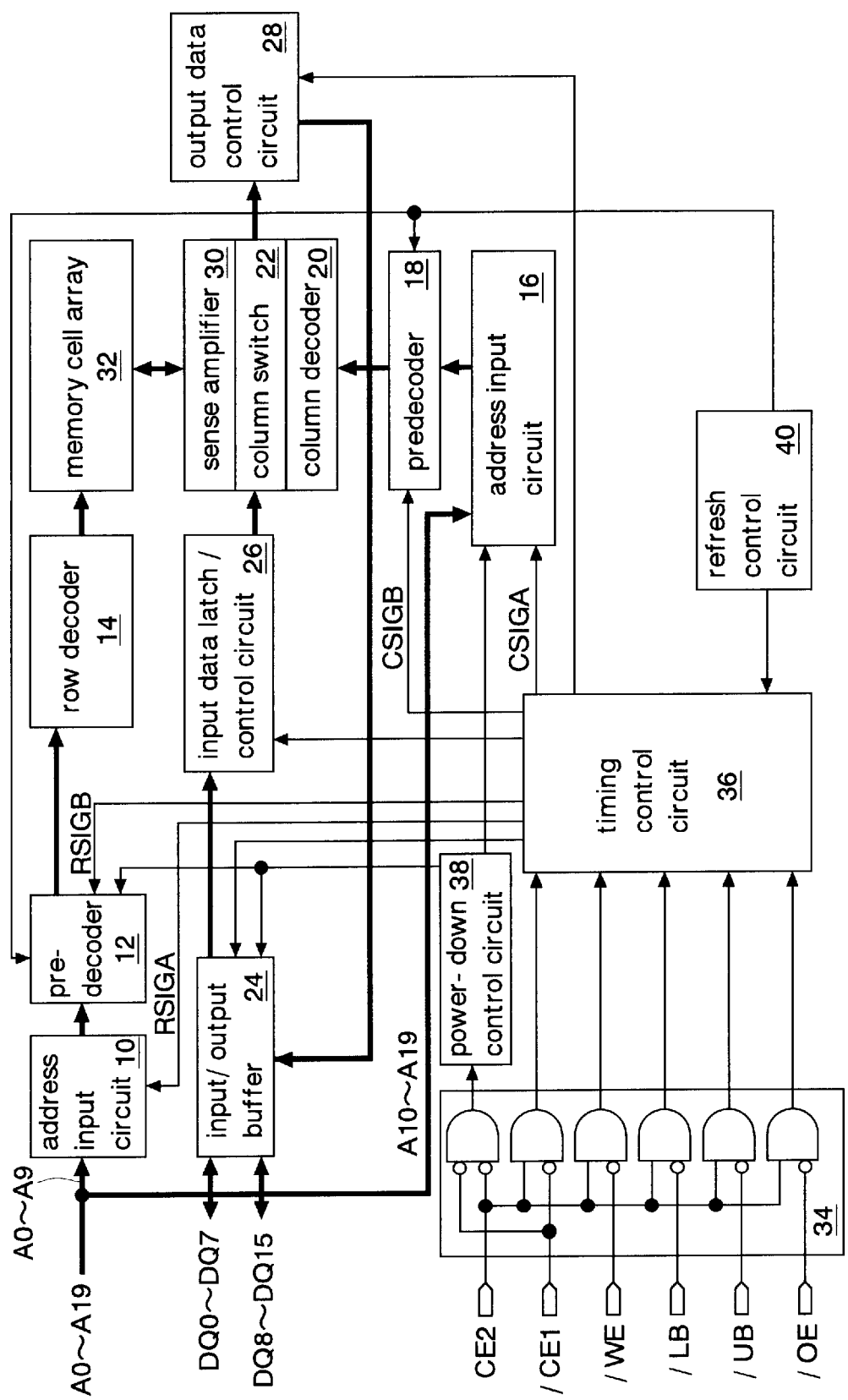
FIG. 1 is a block diagram showing a semiconductor memory according to the present invention.

FIG. 1 shows an embodiment of the semiconductor memory in the present invention.

This semiconductor memory is formed as an FCRAM (Fast Cycle RAM) having DRAM memory cells, on a silicon substrate by using CMOS technologies. The FCRAM has internal operations divided into three stages. The operations in each stage are self-complete. Therefore, not only the input/output of data but also the acceptance of addresses or the like, and the operations of memory cores may be subjected to pipeline processing. This pipeline processing achieves a reduction in operating cycle. The FCRAM in this embodiment adopts an SRAM interface, provided with non-multiplexed address terminals for simultaneous input of a row address and a column address (SRAM compatible). Like ordinary SRAMs, this FCRAM is a clock asynchronous memory which requires no clock signal. That is, the timing design for the system board on which this FCRAM is mounted can be made as in the case of mounting an SRAM. In the drawings, each thick line represents a signal line that consists of a plurality of lines. Signals having preceding "/"s and signals followed by "X"s represent signals of negative logic (activated in low level).

The FCRAM has: an address input circuit 10, a predecoder 12, and a row decoder 14 which correspond to row address signals A0–A9; an address input circuit 16, a predecoder 18, a column decoder 20, and a column switch 22 which correspond to column address signals A10–A19; an input/output buffer 24, an input data latch/control circuit 26, and an output data control circuit 28 which input and output data input/output signals DQ0–DQ15; a sense amplifier 30; a memory cell array 32; a control circuit 34 for control signals (chip enable signals /CE1 and CE2, a write enable signal /WE, a lower byte signal /LB, an upper byte signal /UB, and an output enable signal /OE); a timing control circuit 36; a power-down control circuit 38; and a refresh control circuit 40. Here, the chip enable signals /CE1 and CE2 are turned to low level and high level, respectively, when the FCRAM is activated for a read operation or a write operation. The write enable signal /WE is turned to low level upon write operations. The output enable signal /OE is turned to low level upon read operations. The address signals A0–A19, the data input/output signals DQ0–DQ15, the chip enable signals/CE1 and CE2, the write enable signal /WE, the lower byte signal /LB, the upper byte signal /UB, and the output enable signal /OE shown to the left in the diagram are signals to be supplied and output from/to the exterior of the FCRAM via pads.

The row address signals A0–A9 are transmitted as decoding signals (word line signals) through the address input circuit 10, the predecoder 12, and the row decoder 14 to the memory cell array. The column address signals A10–A19 are transmitted as decoding signals (column line signals) through the address input circuit 16, the predecoder 18, and the row decoder 20, and turn the column switch 22 on.

The data input/output signals DQ0–DQ15 supplied to the input/output buffer 24 are written to the memory cell array 32 through the input data latch/control circuit 26, the column switch 22, and the sense amplifier 30. The data signals read from the memory cell array 32 are amplified in the sense amplifier 30, and output as the data input/output signal DQ0–DQ15 to the exterior through the output data control circuit 28 and the input/output buffer 24.

The input circuit 34 makes logical operations on the control signals /CE1, CE2, /WE, /LB, /UB, and /OE to generate internal control signals, and outputs the generated internal control signals to the power-down control circuit 38 and the timing control circuit 36. The timing control circuit 36 is activated when both the chip enable signals /CE1 and CE2 are activated. The activated timing control circuit 36 controls over write operations when the write enable signal /WE is activated, and controls over read operations when the output enable signal /OE is activated. The timing control circuit 36 activates the circuits corresponding to the data input/output signals DQ0–DQ7 when the lower byte signal /LB is activated. It activates the circuits corresponding to the data input/output signals DQ8–DQ15 when the upper byte signal /UB is activated. In addition, the timing control circuit 36 outputs a control signal RSIGA to the address input circuit 10, a control signal RSIGB to the predecoder 12, a control signal CSIGA to the address input circuit 16, and a control signal CSIGB to the predecoder 18. The control signals RSIGA, RSIGB, CSIGA, and CSIGB are activated upon the activation of the output enable signal /OE or the write enable signal /WE while the chip enable signals /CE1 and CE2 are activated.

The power-down control circuit 38, when both the chip enable signals /CE1 and CE2 are turned to low level, inactivates the address input circuits 10, 16 and the input/output buffer 24 to avoid leakage current at the initial stages of the individual input circuits. The refresh control circuit 40 controls the timing control circuit 36 and the predecoders 12, 18 to make a refresh operation based on internally-generated address signals when a refresh request occurs in the internal circuit.

Figure 2:
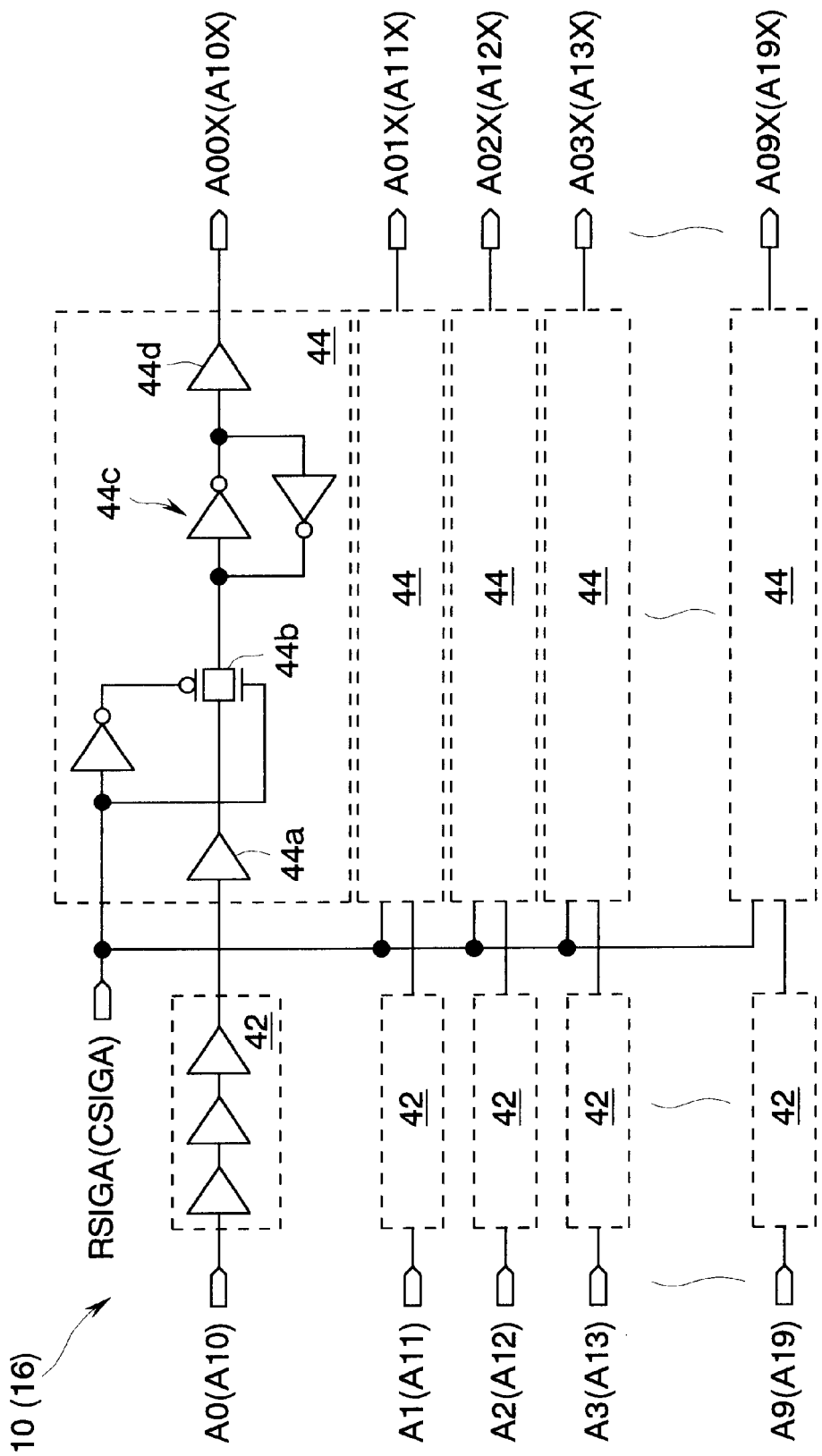
FIG. 2 is a circuit diagram showing the details of an address input circuit of FIG. 1.

FIG. 2 shows the details of the address input circuit 10 (or address input circuit 16). Here, description will be given exclusively of the address input circuit 10 which corresponds to the row address signals A0–A9.

The address input circuit 10 has address buffers 42 for receiving the address signals A0–A9, respectively, and latch circuits 44 (holding parts) for holding the address signals A0–A9, respectively. The latch circuits 44 each include a buffer 44a, a CMOS transmission gate 44b, a latch 44c, and a buffer 44d connected in series. The buffer 44a receives the address signal from the address buffer 42. The latch 44c consists of two inverters having inputs and outputs connected to each other. The buffer 44d outputs the latched address signal as an internal address signal A00X (or A01X–A09X). The CMOS transmission gate 44b turns on when the control signal RSIGA (or CSIGA) is at high level.

Figure 3:
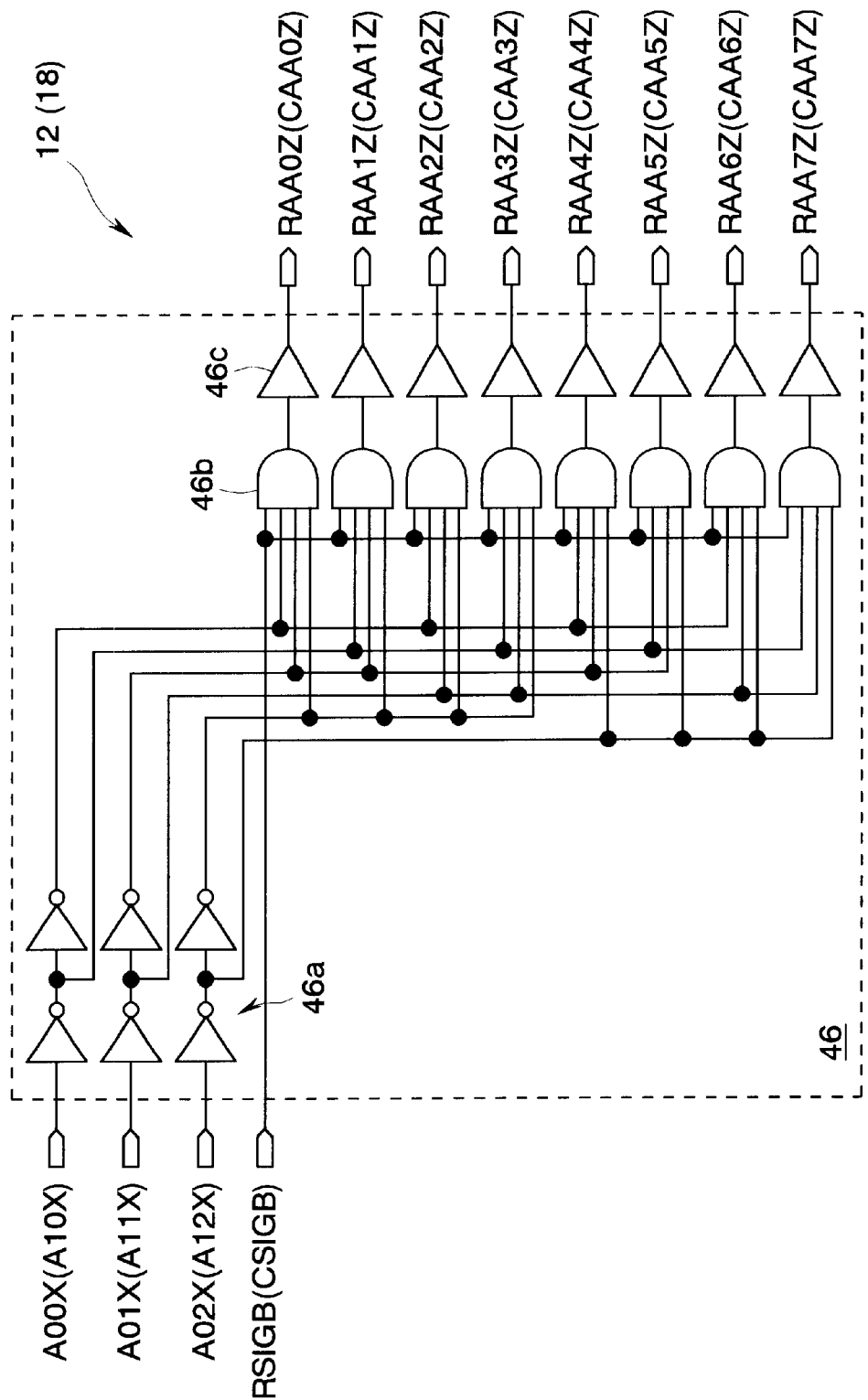
FIG. 3 is a circuit diagram showing the details of a predecoder of FIG. 1.

FIG. 3 shows the details of the predecoder 12 (or predecoder 18). Here, description will be given exclusively of the predecoder 12 which corresponds to the row address signals A0–A9.

The predecoder 12 has a plurality of decoders 46 for decoding three address signals (for example, A00X, A01X, and A02X). The decoders 46 each include: a plurality of inverters 46a for outputting the same logic and inverted logic of the address signals; a plurality of AND circuits 46b which are activated when the control signal RSIGB is at high level, to decode the address signals; and buffers 46c for receiving the outputs of the AND circuits 46b, and outputting the same as decoding signals RAA0Z–RAA7Z (or CAA0Z–CAA7Z), respectively.

Figure 4:
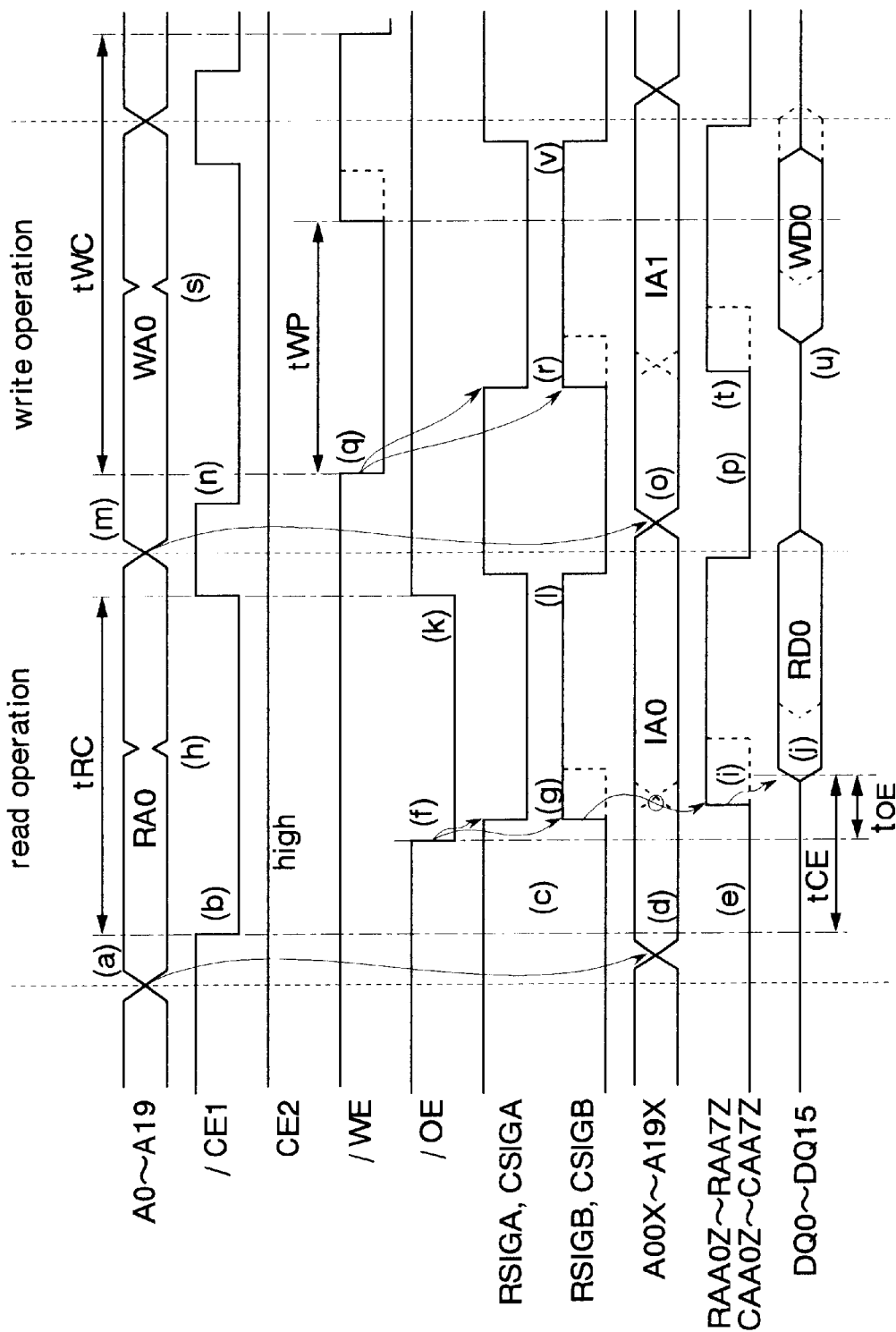
FIG. 4 is a timing chart showing the operations of the semiconductor memory in the present invention.

FIG. 4 shows the timing of the read and write operations in the FCRAM described above. In this embodiment, the chip enable signal CE2 is pulled up on the system board so that it remains at high level all the time. The waveforms shown in broken lines indicate conventional timing.

Initially, in the read operation, the address signals A0–A19 (read address RA0) are supplied to the FCRAM (FIG. 4(a)), followed by the activation of the chip enable signal /CE1 (FIG. 4(b)). Here, the output enable signal /OE and the write enable signal /WE both are inactivated. Therefore, the control signals RSIGA and CSIGA of FIG. 1 are turned to high level, and the control signals RSIGB and CSIGB are turned to low level (FIG. 4(c)). Thus, the CMOS transmission gates 44b in the latch circuits 44 of FIG. 2 turn on, whereby the address signals A0–A19 supplied from exterior are transmitted as the internal address signals A00X–A19X to the predecoders 12 and 18 (FIG. 4(d)). At this moment, the predecoders 12 and 18 shown in FIG. 3 are inactivated under the control signals RSIGB and CSIGB of low level, respectively. This precludes the generation of the decoding signals RAA0Z–RAA7Z and CAA0Z–CAA7Z (FIG. 4(e)).

The output enable signal /OE is activated a predetermined time after the activation of the chip enable signal /CE1 (FIG. 4(f)). The timing control circuit 36 of FIG. 1 turns the control signals RSIGA, CSIGA to low level and the control signals RSIGB, CSIGB to high level (FIG. 4(g)) a predetermined time after the activation of the output enable signal /OE when the chip enable signal /CE1 and CE2 are activated. The CMOS transmission gates 44b in the latch circuits 44 of FIG. 2 turn off under the control signals RSIGA and CSIGA of low level. This prevents subsequent changes in the address signals A0–A19 (transition edges such as noises) from being transmitted to the internal circuit (FIG. 4(h)). The latches 44c in the latch circuits 44 hold the address signals A0–A19 received before the activation of the output enable signal /OE, and output the same as the internal address signals A00X–A19X. That is, the latch circuits 44 permit the reception of the address signals A0–A19 before the activation of the output enable signal /OE, and hold in their latches 44c the address signals A0–A19 that are received upon the activation of the output enable signal /OE. The decoders 46 of FIG. 3 are activated under the control signals RSIGB and CSIGB of high level, to start decoding the internal address signals A00X–A19X. Then, any one of the decoding signals RAA0Z–RAA7Z and any one of CAA0Z–CAA7Z are activated (FIG. 4(i)). Here, as described above, even if the address signals undergo a change because of noises and the like occurring on the system board, the change will not be transmitted to the predecoders 12 and 18. This avoids malfunctions ascribable to such reasons as the multi-selection of word lines or column lines.

In accordance with the decoding signals activated (for example, RAA0Z and CAA0Z), a predetermined word line and column line are selected to read data from a memory cell in the memory cell array 32 of FIG. 1. The read data RD0 is amplified in the sense amplifier 30, and output as the data input/output signals DQ0–DQ15 through the output data control circuit 28 and the input/output buffer 24 (FIG. 4O)). Subsequently, the output enable signal /OE is inactivated to complete the read operation (FIG. 4(k)). The timing control circuit 36, in response to the inactivation of the output enable signal /OE, turns the control signals RSIGA, CSIGA to high level and the control signals RSIGB, CSIGB to low level (FIG. 4(l)).

As a result, a chip enable access time tCE between the activation of the chip enable signal /CE1 and the output of the read data RD0, and an output enable access time tOE between the activation of the output enable signal /OE and the output of the read data RD0 are reduced compared to conventional art. Because of the reductions in the chip enable access time tCE and the output enable access time tOE, it becomes possible to reduce a read cycle time tRC compared to conventional art.

Now, in a write operation, the address signals A0–A19 (write address WA0) are supplied to the FCRAM (FIG. 4(m)) as in a read operation. Subsequently, the chip enable signal /CE1 is activated (FIG. 4(n)). Due to the control signals RSIGA and CSIGA of high level, the address signals A0–A19 supplied from exterior are transmitted as the internal address signals A00X–A19X to the predecoders 12 and 18 (FIG. 4(o)). Since the control signals RSIGB and CSIGB are at low level, the decoding signals RAA0Z–RAA7Z and CAA0Z–CAA7Z will not be activated (FIG. 4(p)).

The write enable signal /WE is activated a predetermined time after the activation of the chip enable signal /CE1 (FIG. 4(q)). The timing control circuit 36 of FIG. 1 turns the control signals RSIGA, CSIGA to low level and the control signals RSIGB, CSIGB to high level (FIG. 4(r)) a predetermined time after the activation of the write enable signal /WE when the chip enable signal /CE1 and CE2 are activated. This timing of change of the control signals RSIGA, CSIGA, RSIGB, and CSIGB is different than in read operations. Moreover, as in a read operation, changes of the address signals A0–A19 (transition edges such as noises) will not be transmitted to the internal circuit after the activation of the write enable signal /WE (FIG. 4(s)). This avoids malfunctions resulting from noises in the address signals A0–A19. The latches 44c in the latch circuits 44 hold the address signals A0–A19 received before the activation of the output enable signal /OE, and output the same as the internal address signals A00X–A19X. Then, decoding signals (for example, RAA7Z and CAA7Z) obtained by decoding the internal address signals A00X-A19X are activated (FIG. 4(t)).

Write data WD0 is supplied to the FCRAM in the form of the data input/output signals DQ0–DQ15, a predetermined setup time before the inactivation of the write enable signal /WE (FIG. 4(u)). The write data WD0 is transmitted to the column switch 22 through the input/output buffer 24 and the input data latch/control circuit 26 of FIG. 1. Then, in accordance with the activated decoding signals RAA7Z and CAA7Z, a predetermined word line and column line are selected so that the write data WD0 is written to a memory cell in the memory cell array 32 of FIG. 1. Subsequently, in response to the inactivation of the write enable signal /WE, the timing control circuit 36 turns the control signals RSIGA, CSIGA to high level and the control signals RSIGB, CSIGB to low level (FIG. 4(v)).

Since the activation timing of the decoding signals RAA0Z–RAA7Z and CAA0Z–CAA7Z can be advanced compared to conventional art, it becomes possible to reduce a write pulse width tWP necessary for a write operation. As a result, a write cycle time tWC from the activation of the write enable signal /WE for a write operation to the activation of the write enable signal /WE for the next write operation can be reduced as compared to conventional art.

As has been described, in the semiconductor memory of the present embodiment, the control signals RSIGA, CSIGA, RSIGB, and CSIGB are changed to control the address input circuits 10, 16 and the predecoders 12, 18, in response to the activation of the output enable signal /OE and the write enable signal /WE. Then, the internal address signals A00X–A19X, which are supplied to the predecoders 12 and 18 before the activation of the output enable signal /OE and the write enable signal /WE, are used to start decoder operations at earlier timing of the operating cycle. Thus, the output timing of the decoding signals RAA0Z–RAA7Z and CAA0Z–CAA7Z can be advanced to reduce the output enable access time tOE and the write pulse time tWP compared to conventional art. This allows a reduction in the read cycle time tRC and the write cycle time tWC.

The reception of new address signals A0–A19 is inhibited after the activation of the output enable signal /OE and the write enable signal /WE. Therefore, the predecoders 12 and 18 can be prevented from decoding incorrect internal address signals A00X–A19X. This can avoid malfunctions of the FCRAM ascribable to such reasons as the multi-selection of word lines or column lines.

Since the latches 44c are formed in the address input circuits 10 and 16, the address signals A0–A19 received in advance can be surely supplied to the predecoders 12 and 18 after the inhibition of the reception of new address signals A0–A19.

Accordingly, even in the FCRAM of clock asynchronous type, the reception of the address signals A0–A19 and the decoding operations can be controlled with reliability.

The embodiment described above has dealt with the case where the present invention is applied to an FCRAM having an SRAM interface. However, the present invention is not limited to such an embodiment. For example, the present invention may be applied to DRAMs such as an SDRAM, or to SRAMs.

In the above embodiments, the levels of control signals RSIGA, RSIGB, CSIGA, and CSIGB are changed in response to the output enable signal /OE and the write enable signal /WE. However, the invention is not limited to such an embodiment. For example, the control signals may be changed in response to the chip enable signal /CE1 (or CE2).

The invention is not limited to the above embodiments and various modifications may be made without departing from the spirit and scope of the invention. Any improvement may be made in part or all of the components.

What is claimed is:

1. A semiconductor memory comprising:
   an address input circuit for transmitting an address signal to an internal circuit before activation of a control signal, and for inhibiting reception of a new address signal after the activation of said control signal; and
   a decoder for receiving said address signal transmitted from said address input circuit, for not operating decoding before the activation of said control signal, and for starting a decoding operation after the activation of said control signal.

2. The semiconductor memory according to claim 1, wherein
   said address input circuit comprises a holding part for permitting the reception of said address signal before the activation of said control signal and for holding said address signal being received upon the activation of said control signal.

3. The semiconductor memory according to claim 1, wherein
   said control signal is an output enable signal for controlling the external output of data read from said memory cell.

4. The semiconductor memory according to claim 1, wherein
   said control signal is a write enable signal for controlling the acceptance of data to be written to said memory cell.

5. The semiconductor memory according to claim 1, wherein
   said control signal is a chip enable signal for activating said internal circuit to be in an operable state.

6. The semiconductor memory according to claim 1, the semiconductor memory being a clock asynchronous type.

7. A method of operating a semiconductor memory, comprising the steps of:
   transmitting an address signal to a decoder and not operating said decoder, before the activation of a control signal; and,
   inhibiting reception of a new address signal and starting a decoding operation of said decoder, after the activation of said control signal.

* * * * *